(12) United States Patent
Andersen et al.

(10) Patent No.: US 6,816,826 B1
(45) Date of Patent: Nov. 9, 2004

(54) FULLY EXHIBITING ASYNCHRONOUS BEHAVIOR IN A LOGIC NETWORK SIMULATION

(75) Inventors: Flemming Andersen, Austin, TX (US); Jason Raymond Baumgartner, Austin, TX (US); Kenneth Douglas Klapproth, Austin, TX (US); Steven Leonard Roberts, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 826 days.

(21) Appl. No.: 09/679,780

(22) Filed: Oct. 5, 2000

(51) Int. Cl.$^7$ ............................................... G06F 17/50
(52) U.S. Cl. ............................. 703/14; 703/15; 703/19; 703/23; 716/7; 716/11; 716/12; 716/16; 716/17; 716/18
(58) Field of Search ............................. 703/14, 19, 23, 703/15; 716/7, 11, 18, 16, 17, 12

(56) References Cited

U.S. PATENT DOCUMENTS

| | | | | |
|---|---|---|---|---|
| 4,697,241 A | | 9/1987 | Lavi | 703/45 |
| 5,544,067 A | * | 8/1996 | Rostoker et al. | 703/14 |
| 5,649,176 A | * | 7/1997 | Selvidge et al. | 713/400 |
| 5,659,716 A | * | 8/1997 | Selvidge et al. | 703/23 |
| 5,946,472 A | | 8/1999 | Graves et al. | 703/6 |

\* cited by examiner

Primary Examiner—Anthony Knight
Assistant Examiner—Thomas Pham
(74) Attorney, Agent, or Firm—Mark E. McBurney; Anthony V. S. England

(57) ABSTRACT

A logic network is simulated, including partitioning logic operations into domains and ranking the operations. Some operations are dependent on source operations from other domains. Pairs of operations having common dependencies are then separated by at least as many operations as the total number of operations in the domains of the respective source operations. All operations are then merged into an order having a certain relation to the respective domain orderings, but omitting nop's inserted to achieve desired separation. Then pairs of operations having common dependency are again separated, this time making advantageous use of overlaps, so that nop's are reduced, to improve simulation time. Due to separations, after one value is computed for one instance of an operation depending on a source operation, a next value is computed for the source operation before computing the next instance of an operation depending on the source operation.

18 Claims, 10 Drawing Sheets

THIRD DOMAIN OPERATION STACK 530

| | |
|---|---|
| 1 | h = fn(c, a, (f)) |
| 2 | i = fn((f), b) |
| 3 | s = fn(h, r) |

SECOND DOMAIN OPERATION STACK 520

| | |
|---|---|
| 1 | c = L116 |
| 2 | f = L122 |
| 3 | L116 = fn(T, (a)) |
| 4 | d = fn((a), Y) |
| 5 | e = fn(d, w) |
| 6 | L122 = fn((a), e) |
| 7 | k = fn(i, h) |

FIRST DOMAIN OPERATION STACK 510

| | |
|---|---|
| 1 | r = L136 |
| 2 | n = L130 |
| 3 | b = L114 |
| 4 | a = fn(T, U) |
| 5 | L114 = fn(X, Y) |
| 6 | o = fn((k), b, z) |
| 7 | L130 = fn(i, (k)) |
| 8 | q = fn(n, o) |
| 9 | L136 = fn((k), q) |

FIG. 5

| FIRST DOMAIN OPERATION STACK 610 | |
|---|---|
| 1 | r |
| 2 | n |
| 3 | b |
| 4 | a |
| 5 | L114 |
| 6 | o |
| 7 | -- |
| 8 | -- |
| 10 | -- |
| 11 | -- |
| 12 | -- |
| 13 | -- |
| 14 | L130 |
| 15 | q |
| 16 | -- |
| 17 | -- |
| 18 | -- |
| 19 | -- |
| 20 | -- |
| 21 | -- |
| 22 | L136 |

| SECOND DOMAIN OPERATION STACK 620 | |
|---|---|
| 1 | c |
| 2 | f |
| 3 | L116 |
| 4 | -- |
| 5 | -- |
| 6 | -- |
| 7 | -- |
| 8 | -- |
| 9 | -- |
| 10 | -- |
| 11 | -- |
| 12 | -- |
| 13 | d |
| 14 | e |
| 15 | -- |
| 16 | -- |
| 17 | -- |
| 18 | -- |
| 19 | -- |
| 20 | -- |
| 21 | -- |
| 22 | -- |
| 23 | L122 |
| 24 | k |

| THIRD DOMAIN OPERATION STACK 630 | |
|---|---|
| 1 | h |
| 2 | -- |
| 3 | -- |
| 4 | -- |
| 5 | -- |
| 6 | -- |
| 7 | -- |
| 8 | -- |
| 9 | i |
| 10 | s |

MERGED OPERATION STACK 810

| | |
|---|---|
| 1 | r |
| 2 | c |
| 3 | h |
| 4 | n |
| 5 | f |
| 6 | b |
| 7 | L116 |
| 8 | a |
| 9 | L114 |
| 10 | o |
| 11 | j |
| 12 | -- |
| 13 | -- |
| 14 | -- |
| 15 | -- |
| 16 | s |
| 17 | d |
| 18 | L130 |
| 19 | e |
| 20 | q |
| 21 | -- |
| 22 | -- |
| 23 | -- |
| 24 | -- |
| 25 | -- |
| 26 | -- |
| 27 | L136 |
| 28 | L122 |
| 29 | k |

FULLY EXHIBITING ASYNCHRONOUS BEHAVIOR IN A LOGIC NETWORK SIMULATION

BACKGROUND OF THE INVENTION

1. Technical Field

The present invention is related generally to simulation, which includes emulation, of the operation of a logic network, and more particularly, to ensuring asynchronous behavior is fully exhibited in such a simulation having rank-ordered logic operations.

2. Description of Related Art

As complexity of today's logic designs increases, more attention is being focused on validation techniques to insure quality, while allowing efficient time to market. This has motivated design reviews, and prompted verification of system level designs, where one or more components are brought together so that their interaction can be examined.

Simulation is the most widely used verification technique. A hardware accelerated version of simulation, ASIC-based processor array emulation has become mainstream. Herein, the term "simulator" is used to encompass both i) a conventional simulator, which uses a general purpose computer with a software model of a logic network under test, and produces a memory representation of inputs and outputs, and ii) an emulator, a special purpose device in which a design is represented, for example, in an array, rather than in a conventional CPU. Examples of emulators are disclosed in the following U.S. patents, which are hereby incorporated herein by reference: Lavi, "Hardware Logic Simulator," U.S. Pat. No. 4,697,241; and Graves et al., "Apparatus and Method for Performing Behavioral Modeling in Hardware Emulation and Simulation Environments," U.S. Pat. No. 5,946,472.

These simulation techniques are based on rank ordering a design net list, and evaluating the rank ordered net list on a cycle by cycle basis. To increase simulator performance, independent operations in the ranked order are separated and mapped to different processors for evaluation in parallel, which requires scheduling of results being passed from one operation to the next and also among the processors.

Once a model is built, rank ordered, and scheduled according to the present state of the art, problems arise regarding coverage of asynchronous events. That is, results of logic operations in a real network ripple through the network almost instantaneously. It is only at selected places in the network that the operations are timed, such as at a boundary between clock domains, for example, where operation results are latched periodically and information is shared across the boundary using handshakes, validity indications and the like. In contrast, a simulator evaluates simulated logic operations in parallel, to a certain extent, and also sequentially, on a regular frequency according to a simulator clock which has no particular relation to the clocks of the logic network. It is problematic that discrepancies may arise regarding functional behavior of an actual logic network, as compared to that of a simulated logic network, particularly with respect to results of logic operations which are performed at different clock rates and passed across boundaries.

SUMMARY OF THE INVENTION

These problems are addressed in a method, computer program product and apparatus for simulating operation of a logic network, according to which logic operations in a network model are partitioned into clock domains. Rank orderings are performed for operations in the respective domains. (A rank ordered set of operations is herein referred to as an "operation stack.") Instances are identified of operations which are dependent on source operations from others of the domains. In a second set of orderings, pairs of the operations having common dependencies are separated, such as by inserting nop's, so that each pair has at least as many operations intervening therebetween as the total number of operations in the domains of the respective source operations. This separating enables input operations to take on new values between dependent evaluations, which is needed due to the operations are computed in all domains according to a "base clock" (i.e., either a system CPU clock or an emulator core clock), It is an objective of separating selected operations, that after one value is computed for one instance of an operation depending on a source operation, a next value is computed for the source operation before computing the next instance of an operation depending on the source operation. That is, maximal asynchronous behavior is exhibited in the simulation, to achieve full coverage of asynchronous events.

In another aspect, the operations of all the domains are merged in an order that has a certain relation to the respective domain orderings, but omits any nop operations that were inserted previously. That is, in this first merged ordering the operation ranked first in the second ordering of the first domain is ranked first in this first merged ordering, unless it is not a nop, in which case it is omitted. The operation ranked first in the second ordering of the second domain, provided it is not a nop, is ranked next in this first merged ordering, and so on throughout all the operations of the domain orderings.

Then, in a second merged ordering, nop's are inserted in the first merged ordering, between pairs of the operations having a common dependency, so that the operations of such a pair are again separated to at least the extent as the previous separations.

It is an objective of the second merged ordering to reduce simulation time. That is, a reduced number of nop's are inserted, as compared to the individual domain orderings, because of advantageous use of overlap in intervening operations between pairs of operations having a common dependency.

It is an advantage of the present invention that any number of operation stacks are supported with any number of nop's, and the merging of the stacks results in an interleaving which tends to be fair for all domains, particularly when the domains have a similar number of operations. Also, although not necessarily yielding an absolute minimum of nop's, due to it's relative simplicity the result is obtained quickly.

These and other advantages of the invention will be further apparent from the following drawings and detailed description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 illustrates orderings of the operations of each of the domains.

FIG. 6 illustrates orderings of the operations of each of the domains, wherein nop's have been selectively inserted to separate certain ones of the operations.

FIG. 8 illustrates another merged ordering again having nop's selectively inserted.

DETAILED DESCRIPTION OF THE PREFERRED EMBODIMENT

Figure 1:
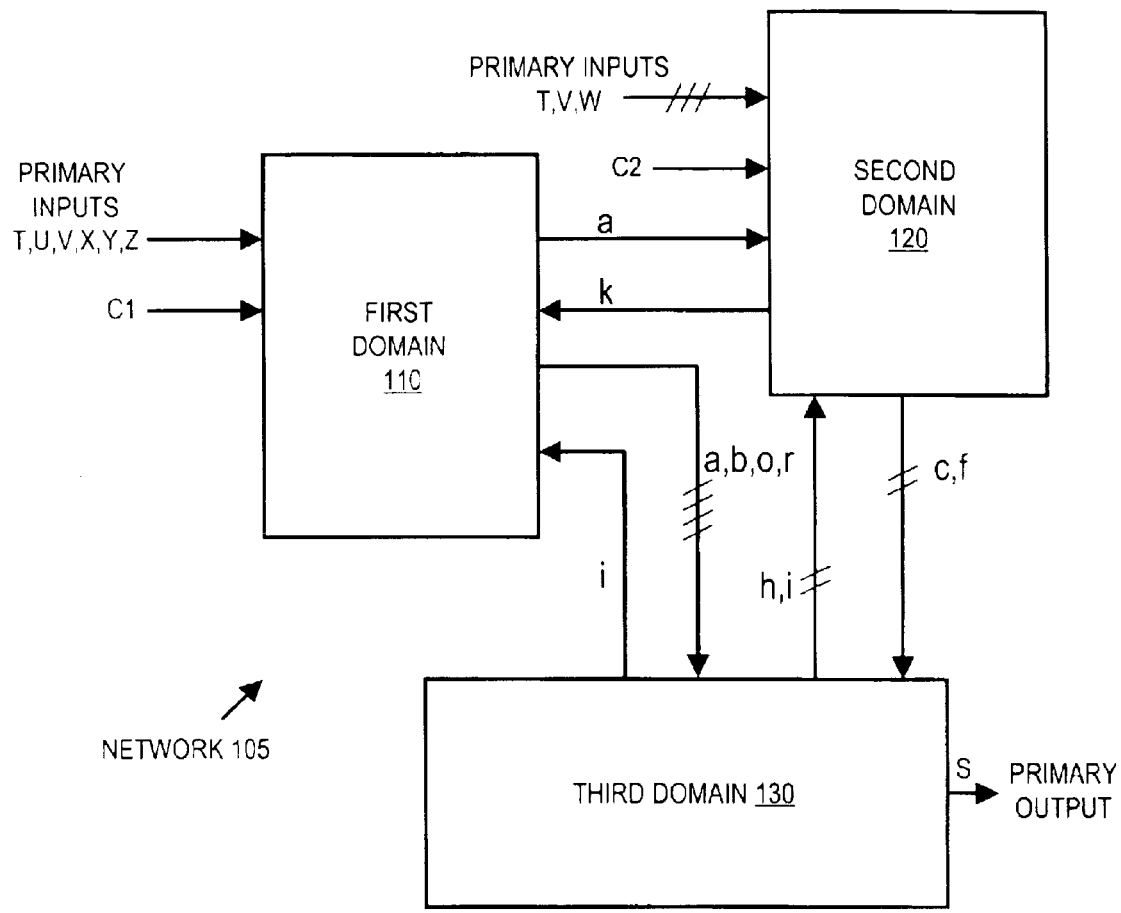
FIG. 1 illustrates a logic network, according to an embodiment of the invention, portioned into three clock domains.

FIG. 1 illustrates a logic network 105 partitioned into three clock domains, first domain 110, second domain 120, and third domain 130. First domain 110 is clocked by clock c1. Second domain is clocked by clock c2. The clock c1 frequency for the first domain 110, may be quite different than the clock c2 frequency for the second domain. Third domain is self-timed logic having no clock. Primary input signals T, U, V, X, Y and Z are generated externally and input to domain 110. T and V are also input to domain 120, along with another primary input signal W. Signals a, b, o and r are generated internally in the first domain 110 and are output to the third domain 130. Signal a is also output to the second domain 120. Signals c and f are generated internally in the second domain 120 and are output to the third domain 130. Signal k is also generated internally in the second domain 120 and output to the first domain 110. Signal i is generated internally in the third domain 130 and output to the first domain 110. Signal i is also output to the second domain 120 along with internally generated signal h. Third domain 130 generates a primary output signal s.

Figure 2:
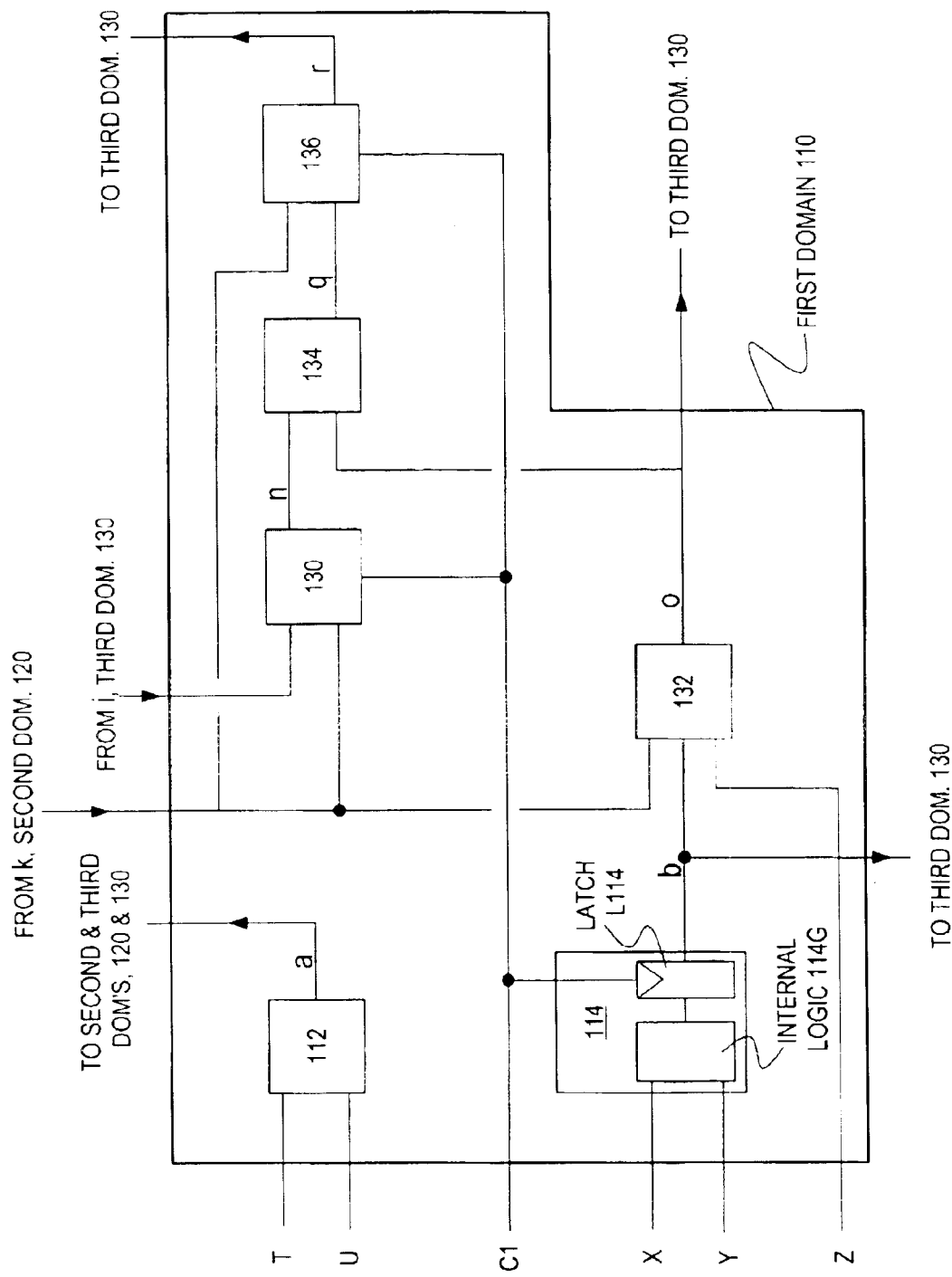
FIG. 2 illustrates logic gates of a first one of the domains of FIG. 1.

FIG. 2 shows details of the first domain 110, in addition to the signals already described. Logic blocks 112, 114, 130, 132, 134 and 136 are interconnected among one another and among the logic blocks of the other domains, as shown. According to the convention herein, each of these blocks may represent a single logic gate or a network of gates. A logic gate or network of gates represents a logic operation. For example, logic block 112 operates on inputs T and U to produce output a.

Also according to convention herein, it is implied that for a logic block which is shown receiving a clock signal, such as blocks 114, 130 and 136 which receive clock signal c1 in this Figure, the block has a clocked latch at the output and a network of internal logic gates ahead of the latch. This is shown explicitly for logic block 114. That is, latch 114*l* is shown at the output of the logic block 114, and a network of internal logic gates 114*g* is shown ahead of the latch 114*l*. For logic block 112, which does not receive and clock, and, accordingly, does not have a latch, the logic block 112 output a is a function, with essentially no delay, of the inputs T and U to the logic block. Whereas, for logic block 114, which does receive a clock c1 and does have a latch, at a given instant output b is the output of latch 114*l*, while the output of internal logic 114*g*, that is, the input to latch 114*l*, is a function of the inputs X and Y at that instant.

Figure 3:
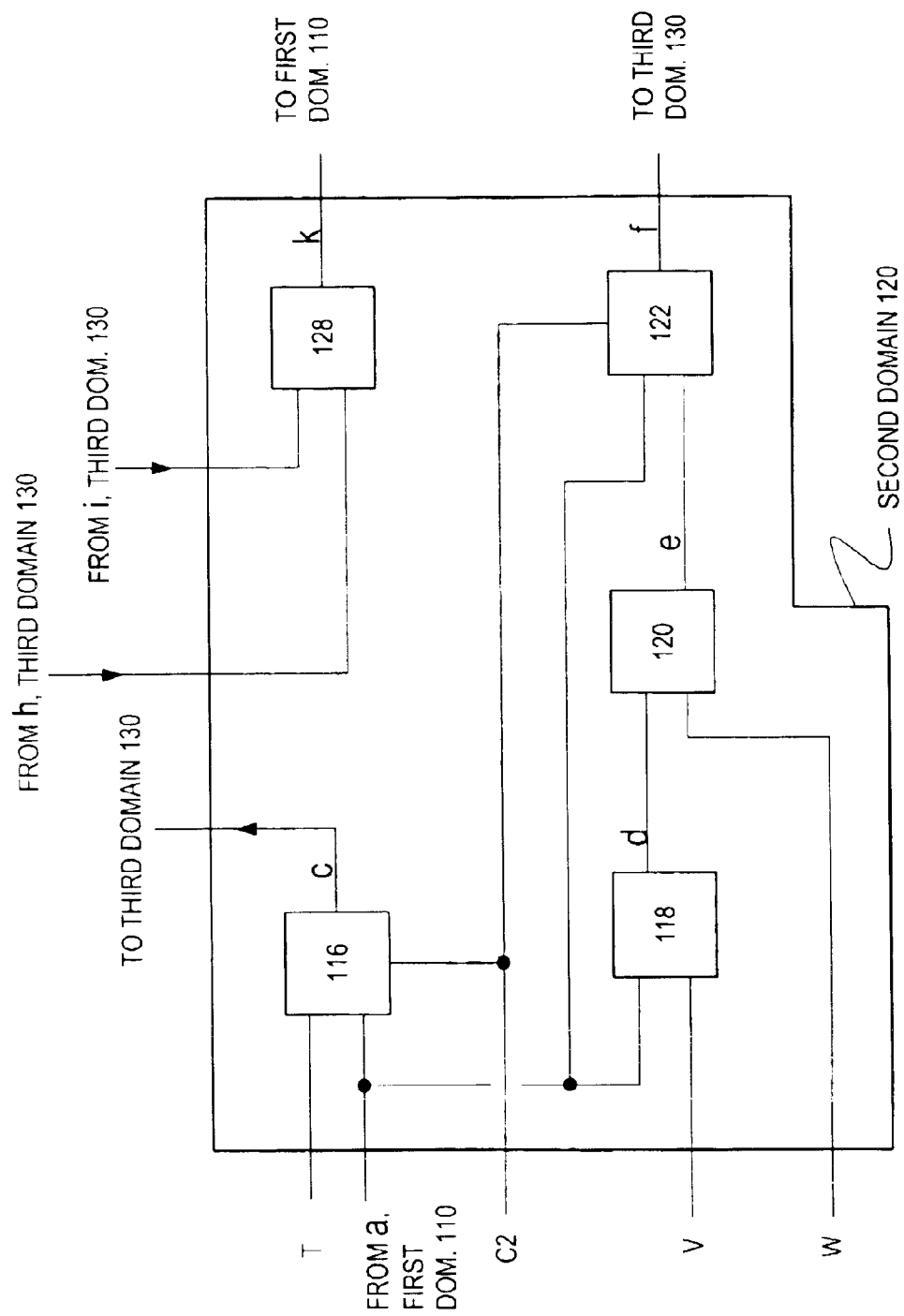
FIG. 3 illustrates logic gates of a second one of the domains of FIG. 1.

FIG. 3 shows details of the second domain 120, in addition to the signals already described. Logic blocks 116, 118, 120, 122, and 128 are interconnected among one another and among the blocks of the other domains as shown. Logic blocks 116 and 122 receive clock c2.

Figure 4:
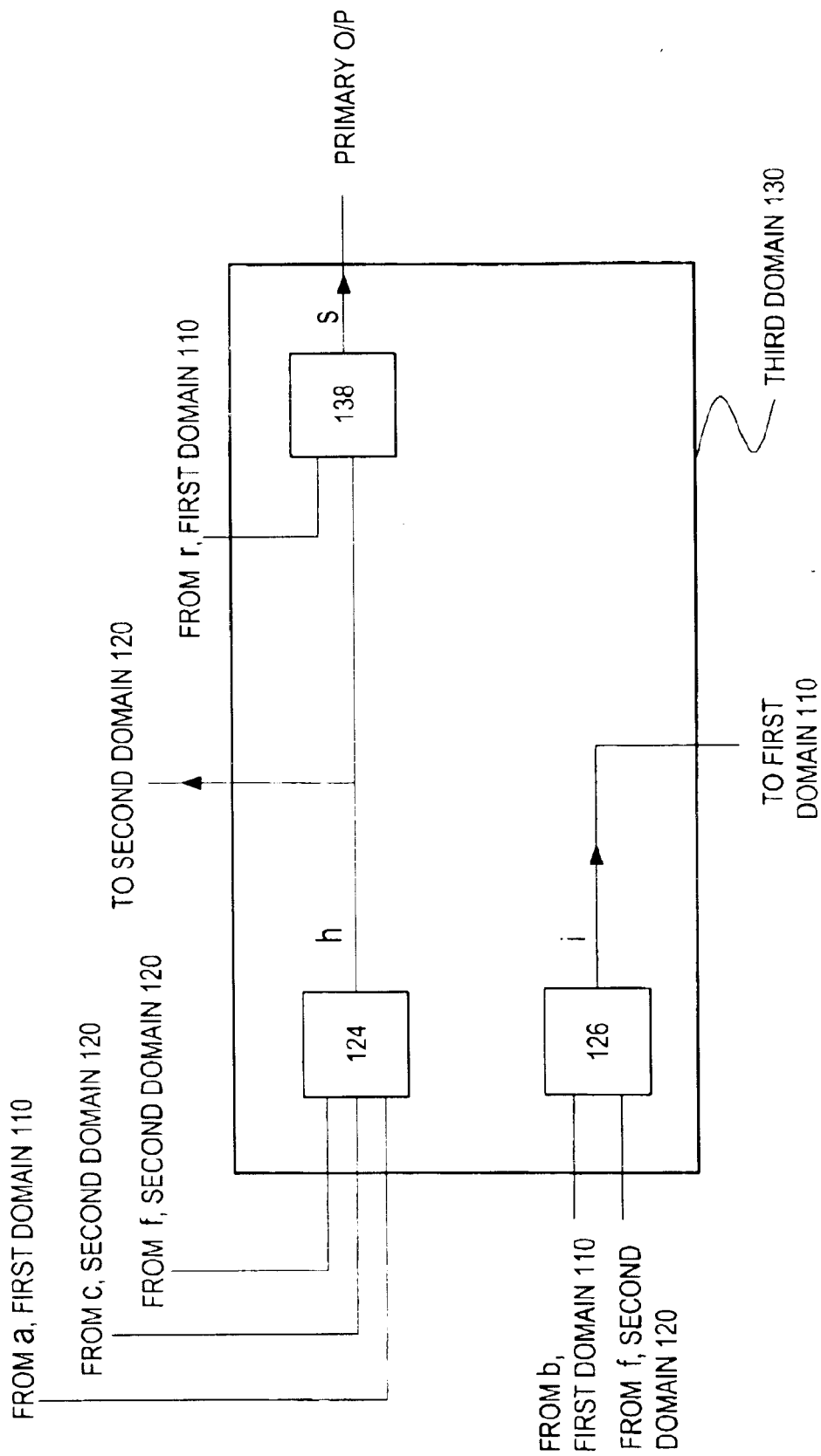
FIG. 4 illustrates logic gates of the third one of the domains of FIG. 1.

FIG. 4 shows details of the third domain 130, in addition to the signals already described. Logic blocks 124, 126 and 138 are interconnected among one another and among the blocks of the other domains as shown.

Note that there are aspects of the network which are not explicitly shown in the above described Figures, which may include latches, handshake processes, and validity indication, but which may be implied, as would be understood by a person of ordinary skill in the field of logic and circuit design.

Each of the three domains 110, 120 and 130 has a respective total number of operations. For example, in the first domain 110, there are nine operations. Referring now to FIG. 5, the total number of operations for each of the three domains may be seen. FIG. 5 also shows an ordering of the operations for each domain. Ranked first are latch output operations.

In FIG. 2, the three logic blocks 114, 130 and 136 for the first domain 110 have implied latches at their outputs, as has been previously described. The three operations associated with these three latches may be ordered in any order with respect to one another, so long as the three latch operations are listed first with respect to unlatched operations. For the example of FIG. 5, the last logic block in the data flow sequence of FIG. 2, logic block 136, has been ranked first in the ordering for domain 110. That is, for the first domain operations stack 510 of FIG. 5, this latch output operation is shown as the first operation in the order, as "r=L136." Next, the logic block 130 latch output operation has been ranked second, listed in the stack 510 as "n=L130." Finally the logic block 114 latch output operation has been ranked third, and listed in the stack 510 as "n=L114."

Next in the order are unlatched operations. These are generally ordered in sequence according to data flow through the domain, that is, from left to right in FIG. 2. However, the operation for calculating a value for "a," the output of logic block 112 is not constrained to any particular rank in the order of operations for domain 110, since none of the other logic blocks in domain 110 depend on "a." This operation has been placed fourth in the order, immediately following the three latch output operations in the order. Regarding operations which are constrained to a particular order, for example, a next value for the latch L114 is calculated (where L114=the output of internal logic 114*g* in logic block 114, which is a function of primary inputs X and Y, as shown) before calculating o, the output of logic block 132, since data flows from logic block 114 to block 132. The calculation of a value for L114 is thus ranked fifth in the domain 110 operation order, as shown in stack 510. Likewise, o and L130 must be calculated before q, and q before L136. A resultant ordering is shown in stack 510.

Similarly, for the second domain 120 and third domain 130, the operations are ordered according to these same constraints, that is latch outputs first, then in sequence according to data flow, which is from left to right as configured in FIGS. 3 and 4.

Next, after ordering the operations as shown in FIG. 5, instances of multiple operations having dependencies on respective common source operations from other ones of the domains are identified. Referring to FIG. 5, the operations in first domain operation stack 510 ranked sixth, seventh and ninth all depend on a value for k. That is, the calculation of k, which is in second domain 120, is a common source operation for calculating o, L130 and L136 in first domain 110. Likewise, the operations in second domain operation stack 520 ranked third, fourth and sixth all depend on a value for a, which is calculated in the first domain 110. And the operations in the third domain operation stack 530 ranked first and second both depend on a value for f, which is calculated in the second domain 120.

Next, after identifying the instances of multiple operations having dependencies on respective common source operations from other ones of the domains, steps must be taken so that the operations having the identified common dependencies are separated by at least as many operations as the total number of operations in the domains of the respective source operations. For example, nop's, which are waiting operations, may be inserted between operations in an operation stack to achieve a required separation. It is also possible to rearrange operation ordering to the extent permitted by the constraints previously described. For example, in operation stack 510, the calculation of a, shown as the fourth ranked operation, could be moved. It would have to be after the third ranked operation, since a is not a latch output, but it could be anywhere after third in the ranking, as previously discussed. Likewise, the calculation of L130 could precede the calculation of o, instead of the vice versa case which is shown, but both must be earlier in the ranking than the calculation of q, since data flows from them to q. This separating of operations having a common dependency is so that after one value is computed for one instance of an operation depending on a source operation, a next value is computed for the source operation before computing the next instance of an operation depending on the source operation.

Referring to FIGS. 5 and 6, this separating of operations is illustrated. First, the separating is done for the first domain 110. That's, a new first domain operation stack 610 is created having nop's inserted appropriately. The first domain 110 operation for calculating o, having a rank of six in the domain 110 order, depends on a source operation k from second 120 domain. The next highest ranked operation in domain 110 that depends on k is the calculation of latch L130, having a rank of seven. Since the second domain operation stack 520 has seven operations, the o and L130 operations must be separated by at least seven operations, to allow time for second domain 120 to evaluate a new value for k. Therefore, in Figure six there is shown seven waiting operations, that is, nop's, inserted between these two operations. Likewise, between the calculations of L130 and L136 there must be least seven operations. However, there is only one operation intervening between these two, that is the calculation of q. Therefore, six nop's are inserted between q and L136, as shown in figure six.

Next, the second and third domain operation stacks 620 and 630 are created having nop's inserted appropriately, as shown.

Figure 7:
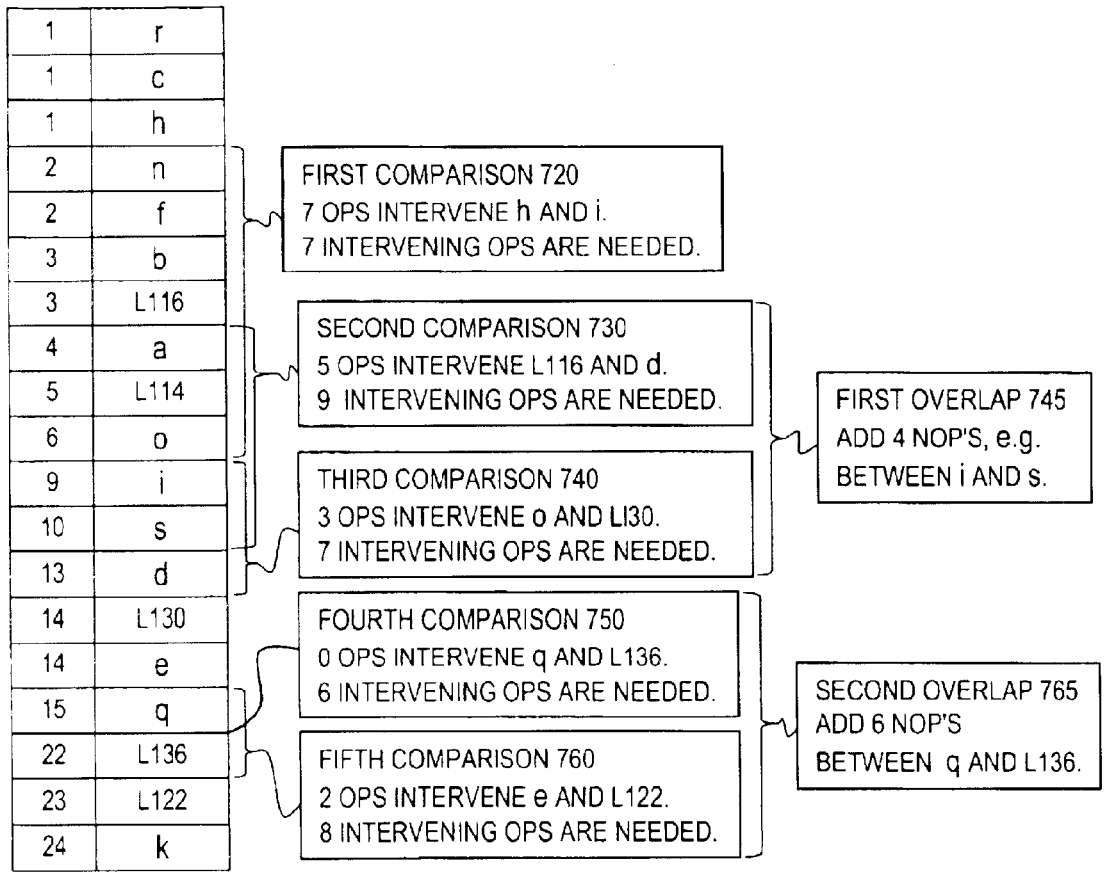
FIG. 7 illustrates a single, merged ordering of the operations, without the nop's.

Next, the operations of all the domains are ordered in a single ordering, as shown in FIG. 7, wherein the single ordering is responsive to the respective domain orderings. That is, a merged operation stack 710 is created using the domain operation stacks 610, 620 and 630. More specifically, the operation r ranked first in the first domain operation stack 610 is ranked first in the merged operation stack 710, the operation c ranked first in the second domain operation stack 620 is ranked second in the merged operation stack 710, the operation h ranked first in the third domain operation stack 630 is ranked third in the merged operation stack 710. Then, the operation n ranked second in the first domain operation stack 610 is ranked next in the merged operation stack 710, the operation f ranked second in the second domain operation stack 620 is ranked next in the merged operation stack 710, and so on. Notice, however, that nop's are omitted.

Next, a new merged operation stack 810 is created, wherein the ordering maintains separations between operations of at least the extent as was determined previously. Steps to convert the merged stack 710 to this new stack 810 are shown in FIG. 7. First, the relative rankings of operations having a common dependency on a source operation, as was shown in FIG. 5, are again compared, to see if there are enough intervening operations separating the instances of the dependent operations. The first comparison 720 indicates that seven intervening operations are required between the pair of operations h and o, and seven exist. The second comparison 730 indicates that nine intervening operations are required between the pair of operations L116 and d, but that only five exist. This will have to be dealt with in a next step, but for now, the rest of the relative rankings of the dependent operations are compared, in pair wise comparisons 740, 750 and 760 as shown.

Nop's will need to be inserted to satisfy the deficits in separations which were identified. In the foregoing comparisons, four cases were identified where nop's need to be inserted in order to adequately separate instances of dependent operations. But first, those cases which overlap are identified, because for an overlap, there may be opportunities to satisfy deficits of two comparisons by the addition of less nop's than would be required if there were no overlap. That is, by identifying cases of overlap in intervening operations between first and second pairs of operations having a common dependency, a reduced number of nop's may be required in order for the new merged ordering to satisfy the deficits for both the pairs.

As shown in FIG. 7, comparisons 730 and 740 overlap at first overlap 745. Likewise, comparisons 750 and 760 overlap at second overlap 765.

For both the second and third comparisons 730 and 740, which overlap at first overlap 745, there is a deficit of four intervening operations. Because the deficits overlap, merely four nop's can be added to satisfy both deficits, such as between operations i and s. Likewise, for second overlap 765, both deficits can be satisfied by adding merely six nop's as indicated.

The merged operation stack 810 which results from the foregoing analysis and insertion of nop's is shown in FIG. 8. Notice that this stack 810 has 29 operations compared to the combined 56 operations of stacks 610, 620 and 630. Stack 810 the same separation constraints of stacks 610, 620 and 630, but with less total nop's, so that less emulator or simulator cycles are necessary to process the operations of stack 810. Note also, that it is common in emulation and simulation applications to map portions of an operation stack such as stack 810 to different processors for evaluation in parallel. To do so, a communication schedule is maintained between processors so that data can be shared across boundaries of the apportioned stack.

Figure 9:
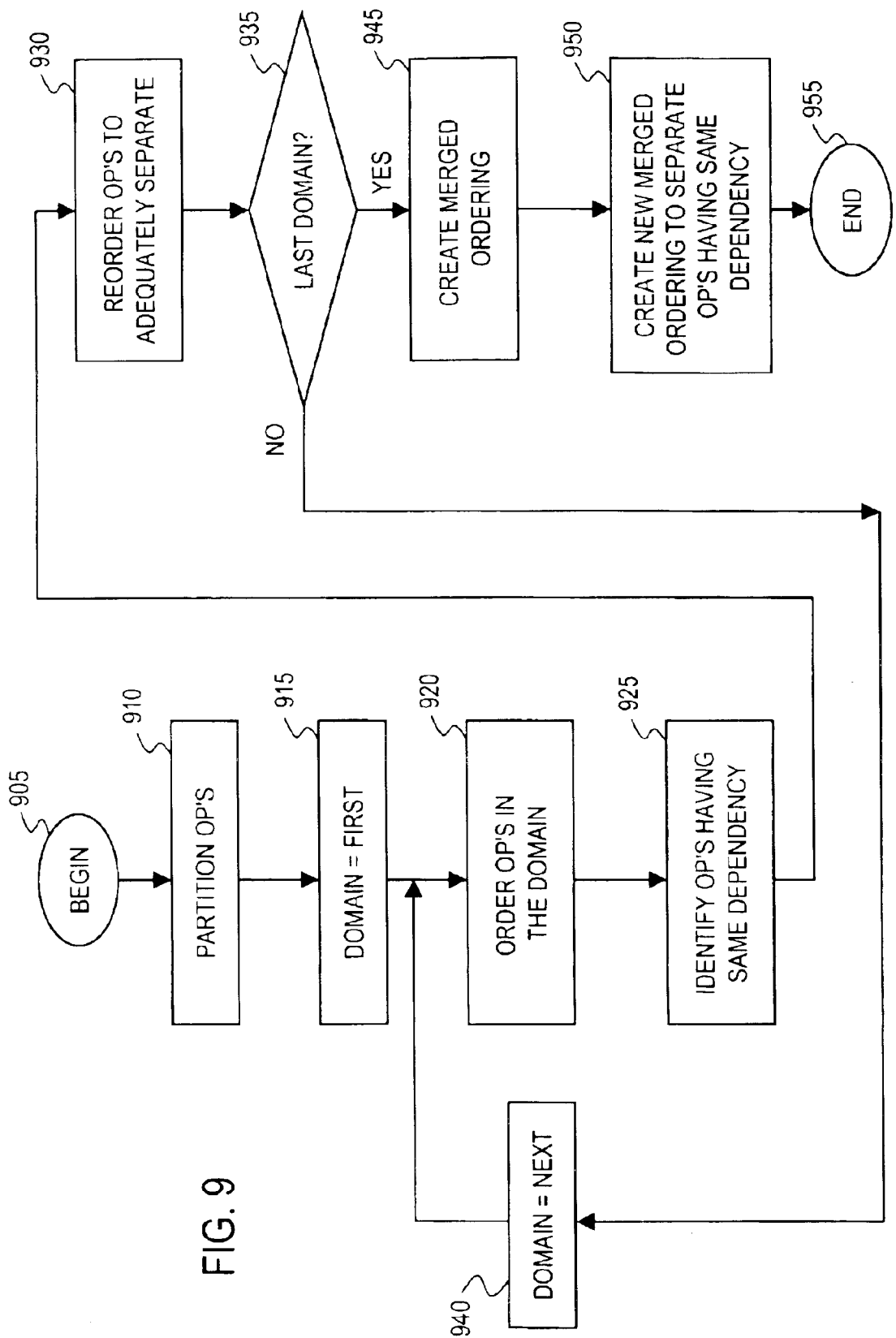
FIG. 9 illustrates an algorithm, in flowchart format, for the embodiment.

Referring now to FIG. 9, a flow chart is shown which sets out the steps which have been illustrated in detail in the foregoing FIGS. 1 through 8. The flow chart begins at 905. In the first substantive step, step 910, the logic operations in a network model are partitioned into domains. This was described in detail above and shown in FIGS. 1 through 4.

Next, at step 915, an interactive sequence is initialized to the first domain.

Next, at step 920, the operations of the first domain are ordered. This was described in detail above and shown in FIG. 5.

Next, at step 925, instances are identified of multiple operations having dependencies on respective common source operations from other ones of the domains. This was also described in detail above in connection with FIG. 5.

Next, at step 930, the operations are reordered, wherein the operations having the common dependencies are separated by at least as many operations as the total number of operations in the domains of the respective source operations. This was described in connection with FIG. 6.

Next, at step 935, the sequencing is tested to see if the last domain has been processed. If not, the processing branches to the next domain at step 940, and goes back to the ordering step 920 for ordering the operations in the second domain, and so on. If the last operations of the last domain has been ordered, the processing branches to step 945, wherein a single, merged ordering is produced for the operations of all the domains. In this step any nop's that were inserted in the individual domain orderings are omitted. This step 945 was described above in detail in connection with FIG. 7.

Next, at step 950, a new merged ordering is created, which maintains the separations between operations of at least the extent as was determined in connection with the several instances of step 930. This step 950 was described above in detail in connection with FIGS. 7 and 8. This step 950 includes comparing, for the ordering of step 945, the relative rankings of operations having a common dependency on a source operation, to see if there are enough intervening operations separating the instances of the dependent operations. This step 950 also includes identifying cases of overlap, and inserting nop's to satisfy the deficits in separations which were identified.

Figure 10:
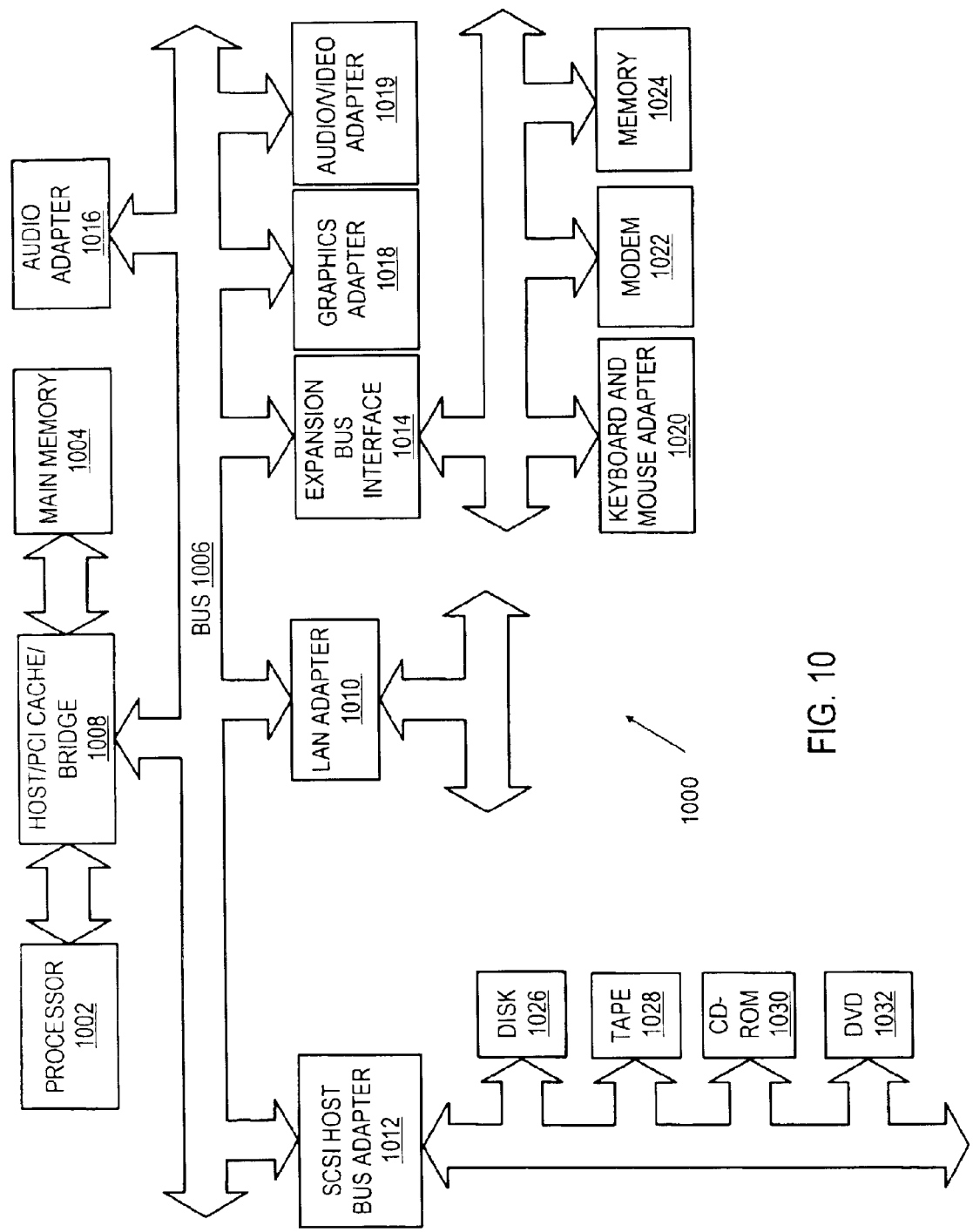
FIG. 10 illustrates a computer system for implementing the embodiment.

With reference now to FIG. 10, a block diagram of a data processing system in which the present invention may be implemented is illustrated. Data processing system 1000 employs a peripheral component interconnect (PCI) local bus architecture. Although the depicted example employs a PCI bus, other bus architectures, such as Micro Channel and ISA, may be used. Processor 1002 and main memory 1004 are connected to PCI local bus 1006 through PCI bridge 1008. PCI bridge 1008 may also include an integrated memory controller and cache memory for processor 1002. Additional connections to PCI local bus 1006 may be made through direct component interconnection or through add-in boards. In the depicted example, local area network (LAN) adapter 1010, SCSI host bus adapter 1012, and expansion bus interface 1014 are connected to PCI local bus 1006 by direct component connection. In contrast, audio adapter 1016, graphics adapter 1018, and audio/video adapter (A/V) 519 are connected to PCI local bus 1006 by add-in boards inserted into expansion slots. Expansion bus interface 1014 provides a connection for a keyboard and mouse adapter 1020, modem 1022, and additional memory 1024. In the depicted example, SCSI host bus adapter 1012 provides a connection for hard disk drive 1026, tape drive 1028, CD-ROM drive 1030, and digital video disc read only memory drive (DVD-ROM) 1032. Typical PCI local bus implementations will support three or four PCI expansion slots or add-in connectors.

An operating system runs on processor 1002 and is used to coordinate and provide control of various components within data processing system 1000 in FIG. 5. The operating system may be a commercially available operating system, such as AIX, which is available from International Business Machines Corporation. "AIX" is a trademark of International Business Machines Corporation. An object oriented programming system, such as Java, may run in conjunction with the operating system, providing calls to the operating system from Java programs or applications executing on data processing system 1000. Instructions for the operating system, the object-oriented operating system, and applications or programs are located on a storage device, such as hard disk drive 1026, and may be loaded into main memory 1004 for execution by processor 1002.

Those of ordinary skill in the art will appreciate that the hardware in FIG. 10 may vary depending on the implementation. For example, other peripheral devices, such as optical disk drives and the like, may be used in addition to or in place of the hardware depicted in FIG. 10. The depicted example is not meant to imply architectural limitations with respect to the present invention. For example, the processes of the present invention may be applied to multiprocessor data processing systems.

It is important also to note that while the present invention has been described in the context of a fully functioning data processing system, those of ordinary skill in the art will appreciate that the processes of the present invention are capable of being distributed in the form of a computer readable medium of instructions, in a variety of forms, and that the present invention applies equally regardless of the particular type of signal bearing media actually used to carry out the distribution. Examples of computer readable media include recordable-type media such as a floppy disc, a hard disk drive, a RAM, and CD-ROMs and transmission-type media such as digital and analog communications links.

The description of the present embodiment has been presented for purposes of illustration and description, but is not intended to be exhaustive or to limit the invention to the form disclosed. Many modifications and variations will be apparent to those of ordinary skill in the art. The embodiment was chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A method for processing logic operations of a network model, comprising the steps of:

a) partitioning the logic operations in the network model into a plurality of domains, wherein a domain has a respective total number of operations;

b) ordering, in first domain orderings, the operations of the respective domains, wherein each operation has a rank and determinable numbers of operations between it and each respective one of the other logic operations of the domain;

c) identifying, in the respective domain orderings, instances of multiple operations independently having dependencies on respective common source operations from other ones of the domains; and d) ordering, in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation.

2. The method of claim 1, wherein one of the second domain orderings includes at least one waiting operation between a pair of the logical operations of one of the first domain orderings.

3. The method of claim 2, comprising the step of:

e) ordering, in a first merged ordering, the operations of all the domains, wherein the first merged ordering is responsive to the respective domain orderings.

4. The method of claim 3, wherein the first merged ordering omits any waiting operations that are in the domain orderings.

5. The method of claim 4, comprising the step of:

f) ordering, in a second merged ordering, the operations of all the domains, wherein the second merged ordering includes separations between pairs of the operations having a common dependency, the separations being of at least the extent as the separations of step d).

6. A method for processing logic operations of a network model, comprising the steps of:

a) partitioning the logic operations in the network model into a plurality of domains, wherein a domain has a respective total number of operations;

b) ordering, in first domain orderings, the operations of the respective domains, wherein each operation has a rank and determinable numbers of operations between it and each respective one of the other logic operations of the domain;

c) identifying, in the respective domain orderings, instances of multiple operations having dependencies on respective common source operations from other ones of the domains;

d) ordering, in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation, and wherein one of the second domain orderings includes at least one waiting operation between a pair of the logical operations of one of the first domain orderings;

e) ordering, in a first merged ordering, the operations of all the domains, wherein the first merged ordering is responsive to the respective domain orderings, wherein the first merged ordering omits any waiting operations that are in the domain orderings; and f) ordering in a second merged ordering, the operations of all the domains, wherein the second merged ordering includes separations between pairs of the operations having a common dependency, the separations being of at least the extent as the separations of step d), and wherein step f) comprises the steps of:

comparing relative rankings in the first merged ordering of the operations having a common dependency on a source operation, to identify deficits in numbers of intervening operations separating pairs of the instances of the dependent operations; and identifying cases of overlap in intervening operations between first and second ones of the pairs of operations having a common dependency, so that a reduced number of waiting operations are required for the second merged ordering to satisfy the deficits for both the pairs.

7. A computer program product for processing logic operations of a network model, comprising:

a) first instruction means for partitioning the logic operations in the network model into a plurality of domains, wherein a domain has a respective total number of operations;

b) second instruction means for ordering, in first domain orderings, the operations of the respective domains, wherein each operation has a rank and determinable numbers of operations between it and each respective one of the other logic operations of the domain;

c) third instruction means for identifying, in the respective domain orderings, instances of multiple operations independently having dependencies on respective common source operations from other ones of the domains; and d) fourth instruction means for ordering, in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation.

8. The computer program product of claim 7, wherein the fourth instruction means includes instruction means for ordering one of the second domain orderings to include at least one waiting operation between a pair of the logical operations of one of the first domain orderings.

9. The computer program product of claim 8, comprising:

e) fifth instruction means for ordering, in a first merged ordering, the operations of all the domains, wherein the first merged ordering is responsive to the respective domain orderings.

10. The computer program product of claim 9, wherein the first merged ordering omits any waiting operations that are in the domain orderings.

11. The computer program product of claim 10, comprising:

f) sixth instruction means for ordering, in a second merged ordering, the operations of all the domains, wherein the second merged ordering includes separations between pairs of the operations having a common dependency, the separations being of at least the extent as the separations provided by the fourth instruction means.

12. A computer program product for processing logic operations of a network model, comprising:

a) first instruction means for partitioning the logic operations in the network model into a plurality of domains, wherein a domain has a respective total number of operations;

b) second instruction means for ordering, in first domain orderings, the operations of the respective domains, wherein each operation has a rank and determinable numbers of operations between it and each respective one of the other logic operations of the domain;

c) third instruction means for identifying, in the respective domain orderings, instances of multiple operations having dependencies on respective common source operations from other ones of the domains;

d) fourth instruction means for ordering, in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation, and wherein the fourth instruction means includes instruction means for ordering one of the second domain orderings to include at least one waiting operation between a pair of the logical operations of one of the first domain orderings;

e) fifth instruction means for ordering, in a first merged ordering, the operations of all the domains, wherein the first merged ordering is responsive to the respective domain orderings, wherein the first merged ordering omits any waiting operations that are in the domain orderings; and f) sixth instruction means for ordering, in a second merged ordering, the operations of all the domains, wherein the second merged ordering includes separations between pairs of the operations having a common dependency, the separations being of at least the extent as the separations provided by the fourth instruction means, and wherein the sixth instruction means comprises:

instruction means for comparing relative rankings in the first merged ordering of the operations having a common dependency on a source operation, to identify deficits in numbers of intervening operations separating pairs of the instances of the dependent operations; and instruction means for identifying cases of overlap in intervening operations between first and second ones of the pairs of operations having a common dependency, so that a reduced number of waiting operations are required for the second merged ordering to satisfy the deficits for both the pairs.

13. An apparatus for processing logic operations of a network model, comprising:

a) means for partitioning the logic operations in the network model into a plurality of domains, wherein a domain has a respective total number of operations;

b) means for ordering, in first domain orderings, the operations of the respective domains, wherein each operation has a rank and determinable numbers of operations between it and each respective one of the other logic operations of the domain;

c) means for identifying, in the respective domain orderings, instances of multiple operations independently having dependencies on respective common source operations from other ones of the domains; and d) means for ordering, in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation.

14. The apparatus of claim 13, wherein the means for ordering the operations in second domain orderings includes means for ordering one of the second domain orderings to include at least one waiting operation between a pair of the logical operations of one of the first domain orderings.

15. The apparatus of claim 14, comprising:

e) means for ordering, in a first merged ordering, the operations of all the domains, wherein the first merged ordering is responsive to the respective domain orderings.

16. The apparatus of claim 15, wherein the first merged ordering omits any waiting operations that are in the domain orderings.

17. The apparatus of claim 16, comprising:

f) means for ordering, in a second merged ordering, the operations of all the domains, wherein the second merged ordering includes separations between pairs of operations having a common dependency, the separations being of at least the extent as the separations provided by the means for ordering the operations in second domain orderings.

18. An apparatus for processing logic operations of a network model, comprising:

a) means for partitioning the logic operations in the network model into a plurality of domains, wherein a domain has a respective total number of operations;

b) means for ordering, in first domain orderings, the operations of the respective domains, wherein each operation has a rank and determinable numbers of operations between it and each respective one of the other logic operations of the domain;

c) means for identifying, in the respective domain orderings, instances of multiple operations having dependencies on respective common source operations from other ones of the domains;

d) means for ordering in second domain orderings, the operations of the respective domains, wherein pairs of the operations having the common dependencies are separated by at least as many operations as the total number of operations in the domains of the respective source operations, so that after one value is computed for one instance of an operation depending on a source operation, a next value is computed for the source operation before computing the next instance of an operation depending on the source operation, and wherein the means for ordering the operations in second domain orderings includes means for ordering one of the second domain orderings to include at least one waiting operation between a pair of the logical operations of one of the first domain orderings;

e) means for ordering, in a first merged ordering, the operations of all the domains, wherein the first merged ordering is responsive to the respective domain orderings, wherein the first merged ordering omits any waiting operations that are in the domain orderings; and f) means for ordering, in a second merged ordering, the operations of all the domains, wherein the second merged ordering includes separations between pairs of operations having a common dependency, the separations being of at least the extent as the separations provided by the means for ordering the operations in second domain orderings, and wherein the means for ordering the operations in a second merged ordering comprises:

means for comparing relative rankings in the first merged ordering of the operations having a common dependency on a source operation, to identify deficits in numbers of intervening operations separating pairs of the instances of the dependent operations; and means for identifying cases of overlap in intervening operations between first and second ones of the pairs of operations having a common dependency, so that a reduced number of waiting operations are required for the second merged ordering to satisfy the deficits for both the pairs.

* * * * *